(12) United States Patent
Razafimandimby

(10) Patent No.: US 12,592,686 B2
(45) Date of Patent: Mar. 31, 2026

(54) ELECTRONIC CIRCUIT AND METHOD

(71) Applicant: STMicroelectronics International N.V., Geneva (CH)

(72) Inventor: Stephane Razafimandimby, La Buisse (FR)

(73) Assignee: STMicroelectronics France, Montrouge (FR)

( * ) Notice: Subject to any disclaimer, the term of this patent is extended or adjusted under 35 U.S.C. 154(b) by 0 days.

(21) Appl. No.: 18/830,200

(22) Filed: Sep. 10, 2024

(65) Prior Publication Data

US 2025/0119129 A1     Apr. 10, 2025

(30) Foreign Application Priority Data

Oct. 10, 2023     (FR) .................................. FR2310834

(51) Int. Cl.
| | |
|---|---|
| *H03K 5/01* | (2006.01) |
| *H03K 3/037* | (2006.01) |
| *H03K 5/02* | (2006.01) |
| *H03K 5/24* | (2006.01) |
| *H04B 5/73* | (2024.01) |

(52) U.S. Cl.
CPC ............... *H03K 5/02* (2013.01); *H03K 3/037* (2013.01); *H03K 5/24* (2013.01); *H04B 5/73* (2024.01)

(58) Field of Classification Search
CPC ......... H03K 3/02; H03K 3/023; H03K 3/027; H03K 3/037; H03K 5/003; H03K 5/007; H03K 5/01; H03K 5/02; H03K 5/08; H03K 5/082; H03K 5/084; H03K 5/086; H03K 5/088; H03K 5/22; H03K 5/24; H04B 5/70; H04B 5/73; G01R 19/165;

G01R 19/16504; G01R 19/16519; G01R 19/16528; G01R 19/16566; G01R 19/1659; G01R 31/31727; H03M 1/001; H03M 1/18; H03M 1/181
See application file for complete search history.

(56) References Cited

U.S. PATENT DOCUMENTS

| | | | |
|---|---|---|---|
| 6,469,547 B1 | 10/2002 | Rabii | |
| 2006/0087467 A1* | 4/2006 | Itskovich | ............... H03M 1/502 |
| | | | 341/155 |
| 2009/0085630 A1 | 4/2009 | Haralabidis | |
| 2020/0153388 A1 | 5/2020 | Nielsen | |
| 2022/0069831 A1* | 3/2022 | Huang | ................. H03F 3/45188 |

FOREIGN PATENT DOCUMENTS

JP          2008199277 A     8/2008

OTHER PUBLICATIONS

Yan, Dongyang et al., "A 3.1-4.2GHz Automatic Amplitude Control Loop VCO with Constant KVCO and <10mV Amplitude Variation", IEEE International Symposium on Circuits and Systems (ISCAS), May 22-25, 2016, 4 pages.

* cited by examiner

*Primary Examiner* — Long Nguyen
(74) *Attorney, Agent, or Firm* — Slater Matsil, LLP

(57) ABSTRACT

The present description relates to an electronic circuit comprising a first circuit configured to generate, based on a first periodic analog signal, a plurality of second signals having offset voltage levels, a second circuit configured to generate third periodic digital signals according to respective crossings, by the second signals, of at least one threshold, and a third circuit configured to determine an amplitude range in which the first periodic analog signal is located, according to a number of the third periodic digital signals.

27 Claims, 9 Drawing Sheets

ELECTRONIC CIRCUIT AND METHOD

CROSS-REFERENCED TO RELATED APPLICATIONS

This application claims the priority benefit of French patent application number 2310834, filed on Oct. 10, 2023, entitled "Circuit électronique," which is hereby incorporated herein by reference to the maximum extent allowable by law.

TECHNICAL FIELD

The present disclosure generally concerns electronic circuits and their operating methods.

BACKGROUND

Electronic circuits, particularly microcontrollers, use periodic signals. These periodic signals may for example originate from oscillators, particularly from crystal oscillators. The measurement and the control of the amplitude of the oscillations are help provide consistent operation from one circuit to the other. Current circuits use a large chip surface area to perform this operation.

SUMMARY OF THE INVENTION

There exists a need to obtain electronic circuits enabling to measure and control the amplitude of the oscillations of periodic signals while decreasing the chip surface area used.

An embodiment overcomes all or part of the disadvantages of known electronic circuits.

An embodiment provides an electronic circuit comprising a first circuit configured to generate, based on a first periodic analog signal, a plurality of second signals having offset voltage levels; a second circuit configured to generate third periodic digital signals according to the crossing, by the second signals, of at least one threshold; and a third circuit configured to determine an amplitude range in which the first signal is located, according to the number of third signals present.

An embodiment provides an operating method of an electronic circuit comprising generating, with a first circuit of the electronic circuit, based on a first periodic analog signal, a plurality of second signals having offset voltage levels; generating, with a second circuit, third periodic digital signals according to the crossing, by the second signals, of at least one threshold; and determining, with a third circuit, an amplitude range in which the first signal is located, according to the number of third signals present.

In an embodiment, each third signal is generated when the second corresponding signal crosses two thresholds.

In an embodiment, the electronic circuit comprises a fourth circuit configured to enable to adjust the amplitude of the first signal according to the determination of the amplitude range.

In an embodiment, the third circuit comprises three branches, each comprising a plurality of flip-flops in series, each branch being configured to respectively receive one of the third signals on the clock input of the flip-flops of this branch.

In an embodiment, each branch comprises at least two D-type flip-flops in series.

In an embodiment, the third circuit comprises a first logic block configured to perform an AND function based on an output of the series of flip-flops of a first branch from among the branches and based on an output of the series of flip-flops of a second branch from among the branches.

In an embodiment, the third circuit comprises a second logic block configured to perform an AND function based on the output of the series of flip-flops of the second branch and based on an output of the series of flip-flops of a third branch from among the branches.

In an embodiment, the third circuit is configured to generate a pulse on a first path when the states of the outputs of the first and of the second branch are identical to a high logic state.

In an embodiment, the third circuit is configured to generate a pulse on a second path when the states of the outputs of the second branch and of the third branch are identical to a high logic state.

In an embodiment, the pulses are generated when the state of the signal at the output of the second branch is a high state.

In an embodiment, the fourth circuit is configured to generate a control signal enabling to modify the amplitude of the first signal according to the presence or to the absence of pulses on the first and second paths.

In an embodiment, each third signal is generated by a respective comparator of a voltage with trigger thresholds having the two thresholds as trigger thresholds.

In an embodiment, each voltage comparator is of Schmitt trigger type.

In an embodiment, each voltage comparator has an input node coupled to a first node, intended to receive the signal to be analyzed, via a respective capacitive element, each input node of each comparator being intended to respectively receive one of the second signals.

In an embodiment, the first circuit comprises resistors in series between a power supply node intended to receive a power supply voltage and the ground, each of the second signals being generated based on the voltage present on a different node corresponding to a junction point of two adjacent resistors of the series of resistors.

In an embodiment, the first circuit comprises a PMOS transistor and an NMOS transistor, each having a conduction node connected to a reference node, the control nodes of the PMOS and NMOS transistors being connected to the reference node, another conduction node of the PMOS transistor being connected to the power supply node and another conduction node of the NMOS transistor being connected to ground.

In an embodiment, the reference node is coupled to ground via one of the resistors of the series of resistors.

In an embodiment, each comparator comprises a dual inverter circuit coupling the power supply node and the ground, the dual inverter circuit comprising two PMOS transistors and two NMOS transistors in series; a control node, common to the PMOS and NMOS transistors, of the dual inverter, being coupled to the reference node.

In an embodiment, the first signal originates from a crystal oscillator.

An embodiment provides an NFC microcontroller comprising a circuit such as described hereabove.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for the understanding of the described embodiments have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings.

Unless specified otherwise, the expressions "about", "approximately", "substantially", and "in the order of" signify plus or minus 10%, preferably of plus or minus 5%.

Figure 1:
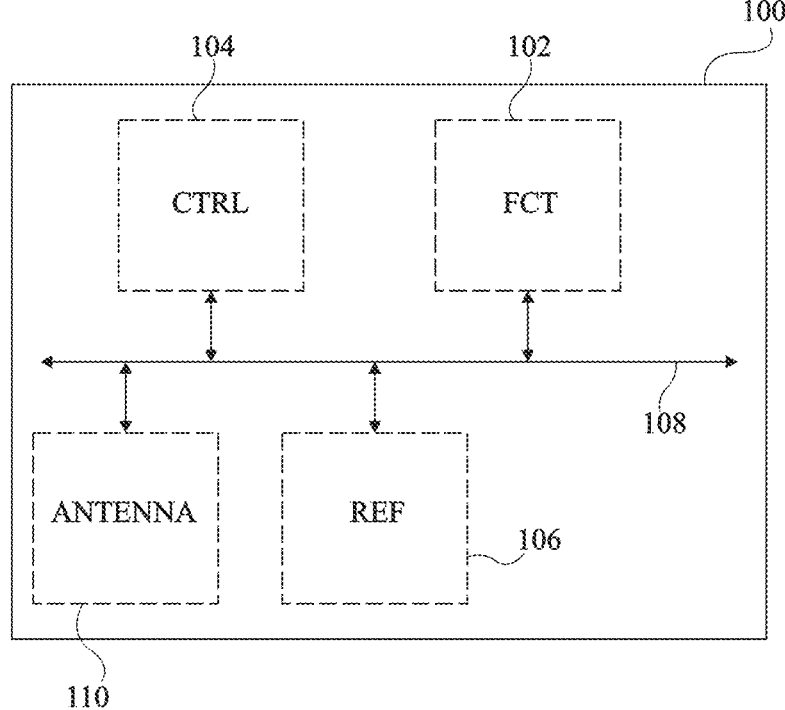
FIG. 1 very schematically illustrates in the form of blocks an example of an electronic circuit of the type to which the described embodiments apply.

FIG. 1 very schematically shows in the form of blocks an example of an electronic device 100 of the type to which the described embodiments apply.

Device 100, which is for example a microcontroller, for example integrates a processing unit 104 (CTRL) comprising one or a plurality of processors for example under control of instructions stored in an instruction memory (not shown).

Device 100 further comprises a module 106 (REF) having a periodic signal generation block comprising one or a plurality of oscillators. The generated signals are for example used for the generation of reference signals such as clock signals. Block 106 for example comprises one or a plurality of crystal oscillators (XO) or voltage-controlled oscillators (VCO). Block 106 for example comprises a circuit for measuring the envelope of the generated periodic signals to verify the amplitude of the generated signals and if need be apply a feedback thereon to keep them within a desired amplitude range.

Device 100 may further integrate an antenna circuit 11o (ANTENNA), for example comprising an antenna and an impedance matching circuit. Device 100 is for example compatible with the near-field communication protocol NFC.

Device 100 may integrate other circuits implementing other functions (for example, one or a plurality of volatile and/or non-volatile memories, other processing units, an input/output interface I/O), symbolized by a block 102 (FCT) in FIG. 1.

Blocks 102, 104, 106, and 11o are for example coupled together and/or to the rest of device 100 via a bus 108 conveying the required signals.

The present disclosure more particularly concerns module 106, which has its generated periodic signals for example used in the processes implemented by the other blocks 102, 104, and 110.

Figure 2:
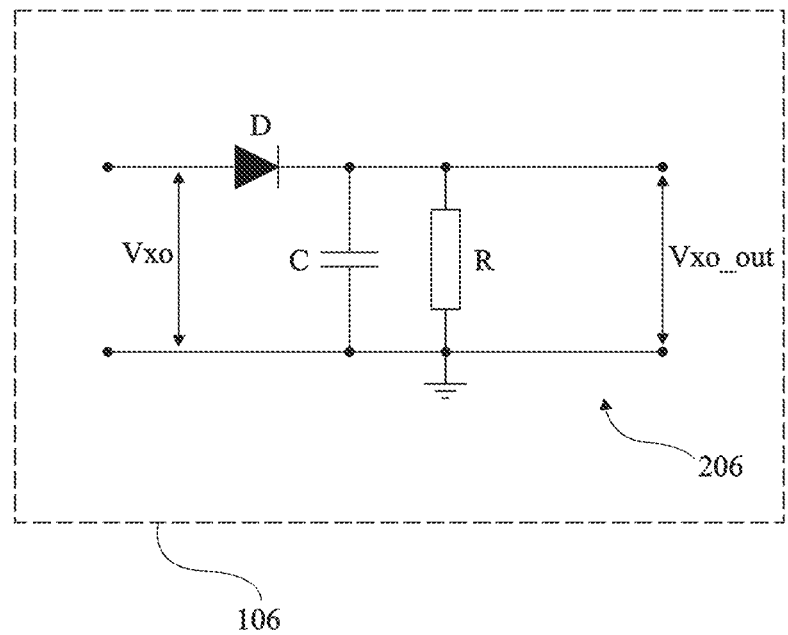
FIG. 2 shows a circuit of a block of FIG. 1 according to an example.

FIG. 2 shows a circuit of the block 106 of FIG. 1 according to an example. More particularly, FIG. 2 shows a circuit 206 configured to measure the envelope of a signal Vxo generated by one of the oscillators of block 106.

The shown circuit 206 comprises a diode D coupled to ground via a capacitive element C and a resistor R associated in parallel. A voltage Vxo_out corresponding to the oscillation amplitude of signal Vxo is measured between the cathode of diode D and the ground.

Figure 3:
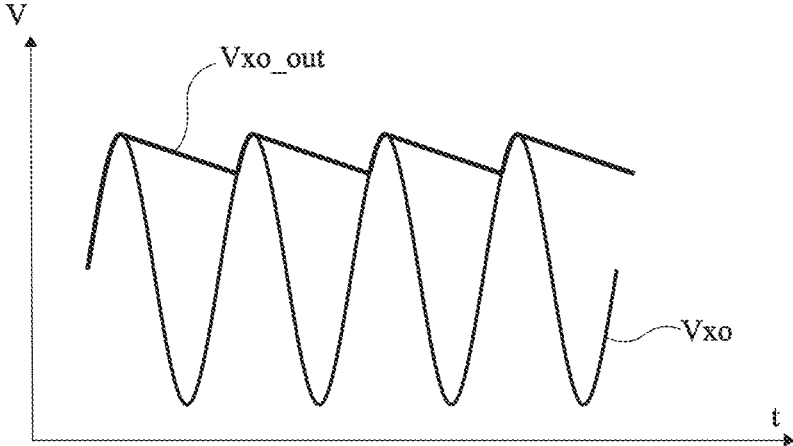
FIG. 3 shows a graph of the operation of the circuit of FIG. 2.

FIG. 3 shows a graph of the operation of the circuit of FIG. 2. More particularly, FIG. 3 illustrates voltage Vxo_out. At each oscillation of signal Vxo, capacitive element C charges on the rising portion, and then slowly discharges on the falling portion when the diode no longer conducts, and this, until the next rising portion of the oscillation, which provides a rectified voltage with a residual periodic variation (ripple). Voltage Vxo_out is then more precisely estimated by means of one or a plurality of differential comparators (not shown herein), one of the inputs of which will be the comparison DC voltage level to provide a stable result despite the ripple. In this example, one should implement as many comparators as DC voltage levels to be compared.

With the miniaturization of circuits, the chip surface area necessary to implement the components of circuit 206, as well as for the differential comparators, has to be decreased.

For this purpose, the described embodiments provide an electronic circuit comprising a first circuit configured to generate, based on a first periodic analog signal, a plurality of second signals having offset DC voltage levels; a second circuit configured to generate third digital periodic signals according to the crossing, by the second signals, of at least one threshold; and a third circuit configured to determine an amplitude range in which the first signal is located, according to the number of third signals present.

This enables to simplify the design, as well as to decrease the necessary chip surface area by a factor greater than two.

Figure 4:
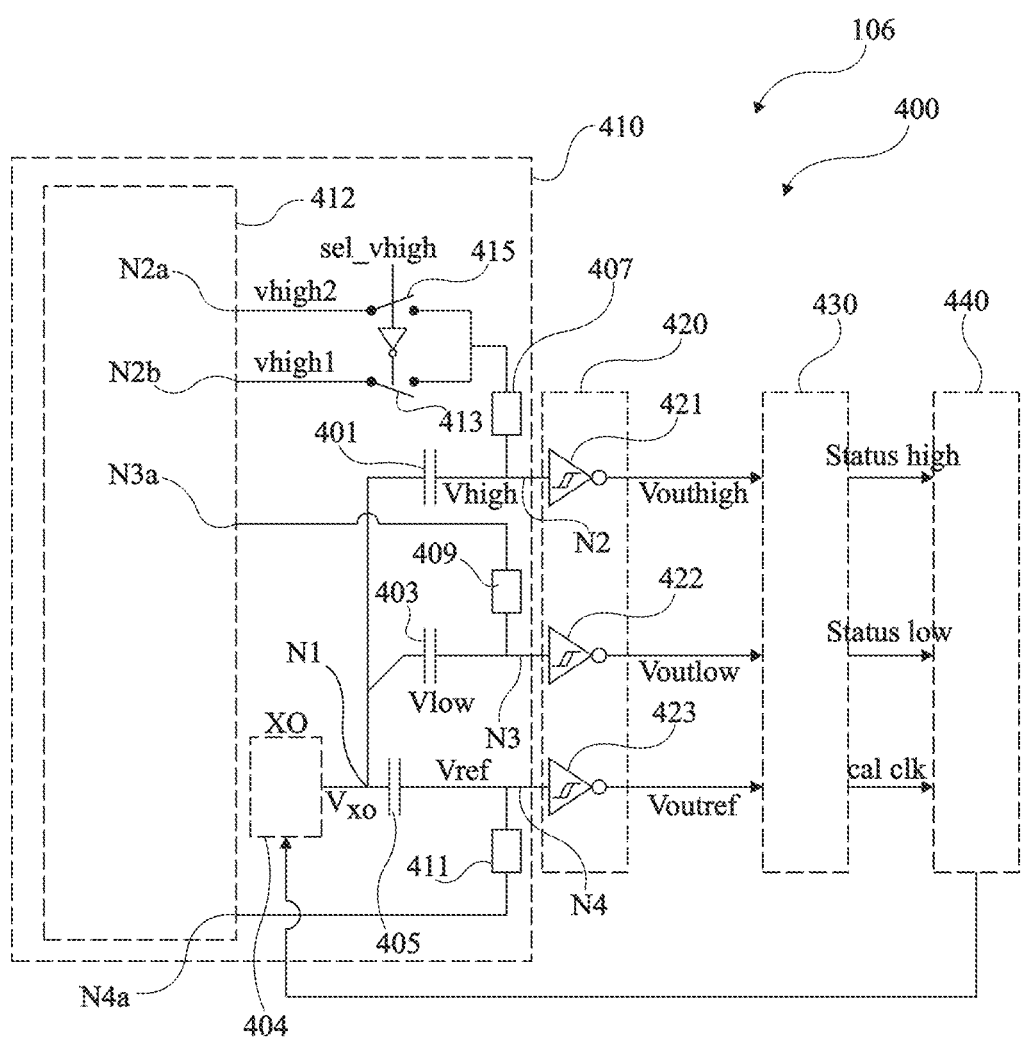
FIG. 4 very schematically shows a circuit of a block of FIG. 1 according to an embodiment.

FIG. 4 shows very schematically shows a circuit of a block of FIG. 1 according to an embodiment.

More particularly, FIG. 4 illustrates an embodiment of an electronic circuit 400 of block 106.

Circuit 400 comprises a first circuit 410 configured to generate, based on a first periodic analog signal Vxo issued by the oscillator 404 (XO) of block 106, a plurality of second signals Vhigh, Vlow, and Vref, having offset voltage levels, respectively on nodes N2, N3, and N4.

In the shown example, circuit 410 comprises three capacitive elements 401, 403, 405 respectively coupling nodes N2, N3, and N4 to a node N1 having signal Vxo arriving thereon.

Circuit 410 comprises a resistor 407 coupling node N2 and a node N2*a* via a first optional switch 415. Resistor 407 further optionally couples node N2 and a node N2*b* via a second switch 413. The control signals sel_vhigh of the first and second switches are inverted between the two switches. The use of optional switches 413 and 415 enables to condition the starting of the feedback on the oscillator implemented by circuit 440 based on a threshold different from the final target voltage.

Circuit 410 also comprises a resistor 409 coupling node N3 and a node N3*a* as well as a resistor 411 coupling node N4 and a node N4*a*.

In the shown example, nodes N2*a*, N2*b*, N3*a*, and N4*a* are coupled to a circuit 412 configured to generate voltages offset with respect to one another. Capacitive elements 401, 403, 405 enable to cut off the DC voltage level of oscillation signal Vxo and resistors 407, 409, and 411 enable to apply the respective offset of the voltages present on nodes N2*a*, N2*b*, N3*a*, and N4*a* to signal Vxo comprising no DC voltage. Voltages Vhigh, Vlow, and Vref, thus are the images of signal Vxo with an offset voltage, as are the voltages present on nodes N2*a* or N2*b*, N3*a*, and N4*a*.

In the shown example, circuit 400 also comprises a second circuit 420 configured to generate third periodic digital signals Vouthigh, Voutlow, and Voutref according to the crossing, by second signals Vhigh, Vlow, and Vref, of at least one threshold, preferentially two thresholds. Circuit 420 comprises an input coupled to node N2, an input coupled to node N3, and another input coupled to node N4. Circuit 420 comprises a first voltage comparator 421 coupling node N2 to a first input of a third circuit 430; a second voltage comparator 422 coupling node N3 to a second input of circuit 430; and a third voltage comparator 423 coupling node N4 to a third input of circuit 430. In an example, each of the voltage comparators has two trigger thresholds Vhyst_l, Vhyst_h and is for example of Schmitt trigger type. In operation, each third signal is generated independently from the others from the moment that the second corresponding signal crosses the two thresholds Vhyst_l, Vhyst_h. Each third signal Vouthigh, Voutlow, and Voutref is a periodic square-pulse signal alternating between a high state and a low state, thus forming a digital signal with different duty cycles.

In the shown example, circuit 400 comprises a third circuit 430 configured to determine an amplitude range in which first signal Vxo is located, according to the number of third signals present.

In an example, circuit 430 is configured to verify, synchronously with a reference signal (cal clk) originating from Voutref, which of the third signals is present. Thus, a pulse is generated on a first path (Status low) when the third signal Voutlow is periodically established at the same frequency as that of signal cal clk. Similarly, a pulse is generated on a second path (Status high) when the third signal Vouthigh is periodically established at the same frequency as that of signal cal clk is in the high state.

If only the third signal Voutref is periodically generated but the third signals Voutlow and Vouthigh are not periodically generated, this means that the amplitude of signal Vxo is located in a first amplitude range lower than 2*(Vlow−Vref)+Vhyst_l. In another example, if only the third signals Voutref and Voutlow are periodically generated but the third signal Vouthigh is not periodically generated, this means that the amplitude of signal Vxo is located in a second amplitude range between 2*(Vhigh−Vref)+Vhyst_l and 2*(Vlow−Vref)+Vhyst_l. In another example, if the third signals Vouthigh, Voutref, and Voutlow are periodically generated, this means that the amplitude of signal Vxo is located in a third amplitude range higher than 2*(Vhigh-Vref)+Vhyst_l.

In the shown example, circuit 400 comprises a fourth circuit 440 configured to enable to adjust the amplitude of signal Vxo according to the determination of the amplitude range of this signal Vxo.

The fourth circuit receives as an input the first and second paths as well as signal cal clk. At its output, it is coupled, preferably connected, to oscillator 404. In an example, the fourth circuit 440 generates a control signal enabling to modify the amplitude of signal Vxo according to the presence or to the absence of pulses on the first and second paths (respectively Status low, Status high) synchronously with signal cal clk. In an example, if a pulse is present at the same time on cal clk, on the first path (Status low), and on the second path (Status high), this means that the amplitude of signal Vxo is located in the third amplitude range and that one should for example decrease the oscillator power supply control signal to decrease the oscillation amplitude. If a pulse is present at the same time on cal clk and on the first path (Status low) but not on the second path (Status high), this means that the amplitude of signal Vxo is located in the second amplitude range and that it is not necessary to modify the power supply current of the oscillator. If a pulse is present on cal clk, but not on the first path (Status low) nor on the second path (Status high), this means that the amplitude of signal Vxo is located in the first amplitude range and that a feedback should be applied to the oscillator for example by increasing the bias current of oscillator 404.

In an example, to improve the robustness of circuit 106, and for example to do away with the possibility of the presence of parasitic pulses on the third signals, it is possible to check for the presence of the third signals over a time range of a plurality of consecutive periods of signal Voutref, for example.

The chip surface area necessary for the implementation of circuit 400 is at least twice smaller than that of an envelope detector such as shown in FIG. 2.

Figure 5:
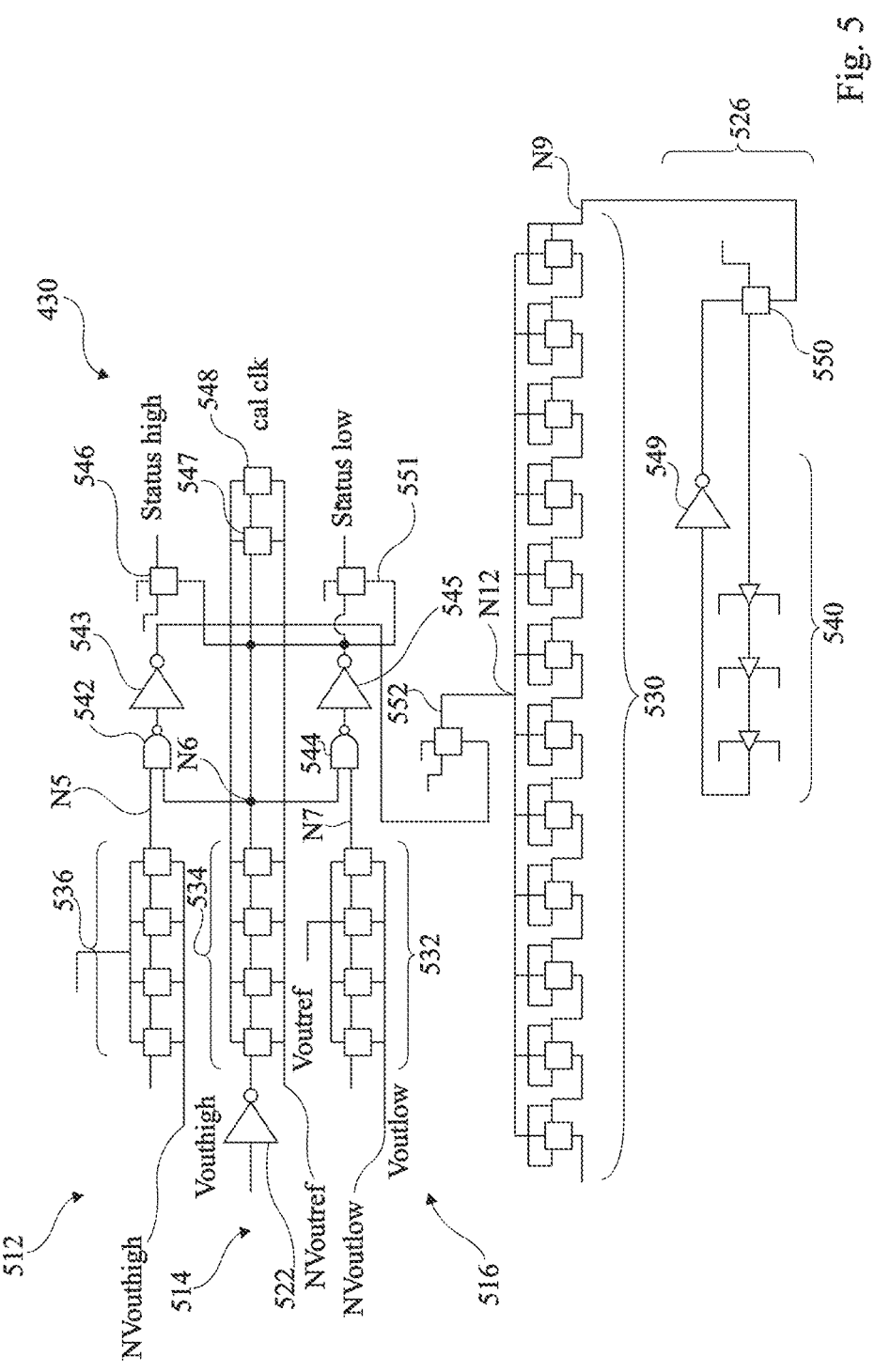
FIG. 5 shows a circuit of FIG. 4 according to an embodiment.

FIG. 5 shows a circuit of FIG. 4 according to an embodiment. More particularly, FIG. 5 illustrates an embodiment of circuit 430.

In the shown example, circuit 430 comprises a first branch 512 having for example four flip-flops 536, in series, with their clock inputs coupled together and to a node NVouthigh configured to receive third signal Vouthigh. The terms "flip-flops in series" mean that the input of one of the flip-flops is coupled to the output of the previous one. The last flip-flop in the series of flip-flops 536 is coupled, preferably connected, to a node N5.

Circuit 430 for example comprises a second branch 514 with for example four flip-flops 534 in series, with their clock inputs coupled together and to a node NVoutref configured to receive the third signal Voutref. The last flip-flop in the series of flip-flops 534 is coupled, preferably connected, to a node N6.

In an example, the second branch 514 further comprises two other flip-flops 547, 548 in series with the series of flip-flops 534, their clock inputs being coupled together and to node NVoutref. The data input of flip-flop 548 is for example connected to node N6. The signal at the output of flip-flop 548 is for example signal cal clk.

Circuit 430 for example comprises a third branch 516 with for example four flip-flops 532 in series with their clock inputs coupled together and to a node NVoutlow, configured to receive signal Voutlow. The last flip-flop in the series of flip-flops 532 is coupled, preferably connected, to a node N7.

In the shown example, the number of flip-flops in the series has to be identical in each of branches 512, 514, and 516 for groups 532, 534, and 536.

In an example, the reset inputs of the flip-flops of a series of a same branch are connected together.

In another example, an inverter 522 is for example series-connected with the data input of the first flip-flop in the series of flip-flops 534 of the second branch 514. In this case, the data inputs of the first flip-flops of series 532 and 536 are coupled together to a high logic level while the reset input of the flip-flops of series 532 and 536 is also coupled to the input of inverter 522.

In the shown example, circuit 430 further comprises a first logic function formed by a NAND logic gate 542 in series with an inverter 543 and a second logic function formed by a NAND logic gate 544 in series with an inverter 545. The association of circuits 542 and 543 forms an AND function based on the signals present on nodes N5 and N6. The association of circuits 544 and 545 is configured to perform an AND function based on the signals present on nodes N6 and N7. Those skilled in the art will may implement other logic gates than a NAND gate in series with an inverter to obtain an AND logic function. The generated signals will respectively define the simultaneous presence of synchronous signals on nodes NVoutref and NVoutlow and on NVoutref and NVouthigh.

In the shown example, circuit 430 further comprises flip-flops 546, 551, and 552. Flip-flop 552 has its clock input coupled to the output of the logic function formed by logic gates 542, 543 and its output coupled to a node N12. Flip-flop 551 has its data input coupled to the output of the logic function provided by the association of circuits 544 and 545 and its clock input coupled to node N6. Signal Status low can be found at the output of flip-flop 551. Flip-flop 546 has its clock input coupled to node N6. Signal Status high can be found at the output of flip-flop 546.

In the shown example, circuit 430 further comprises a frequency divider circuit 530 coupling node NVoutref to a node N9. Circuit 530 consists of flip-flops connected together so that the output of one flip-flop is connected to the clock input of the next flip-flop. This enables to divide the frequency of the signal present on the clock input of the first flip-flop and this, as often as there are flip-flops in circuit 530. In the shown example, circuit 530 comprises twelve flip-flops and the frequency present on the input of the first flip-flop (on the left-hand side) of circuit 530 is divided by 2^12. Circuit 530 enables to define the period between each pulse of signal cal clk.

In the shown example, circuit 430 further comprises a circuit 526 configured to generate a time window. Circuit 526 comprises a flip-flop 550 having its clock input coupled to node N9 and having its data input connected to a high logic level. An output of flip-flop 550 is coupled to one or a plurality of (for example three) time-shift cells associated in a series 540. The output of the last time-shift cell is coupled to a reset input of flip-flop 550 via an inverter 549. The output of flip-flop 550 is coupled to the reset inputs of flip-flops 546, 547, 548, and 551.

In an example, the flip-flops of the circuit 430 of FIG. 5 are of type D.

In operation, circuit 526 defines a time length of a window for observing the results of presence of simultaneous and synchronous signals on NVoutref and NVoutlow and on NVoutref and NVouthigh. In other words, circuit 526 defines, at each calibration period, the generation of pulses Status high, Status low, and cal clk over a duration of pulse t for which a pulse is also transmitted on signal cal clk.

In operation, circuit 526 defines the resetting to zero of signals Status high, Status low, and cal clk after the time window defined by circuit 526 via inverter 549.

The resetting of the flip-flops of series 536 and 532 is provided by the result of branch 534. This allows a continuous frequency control, every four rising edges of signal Voutref due to inverter 522, but the result of which will be verified at each calibration period for a time length t.

Figure 6:
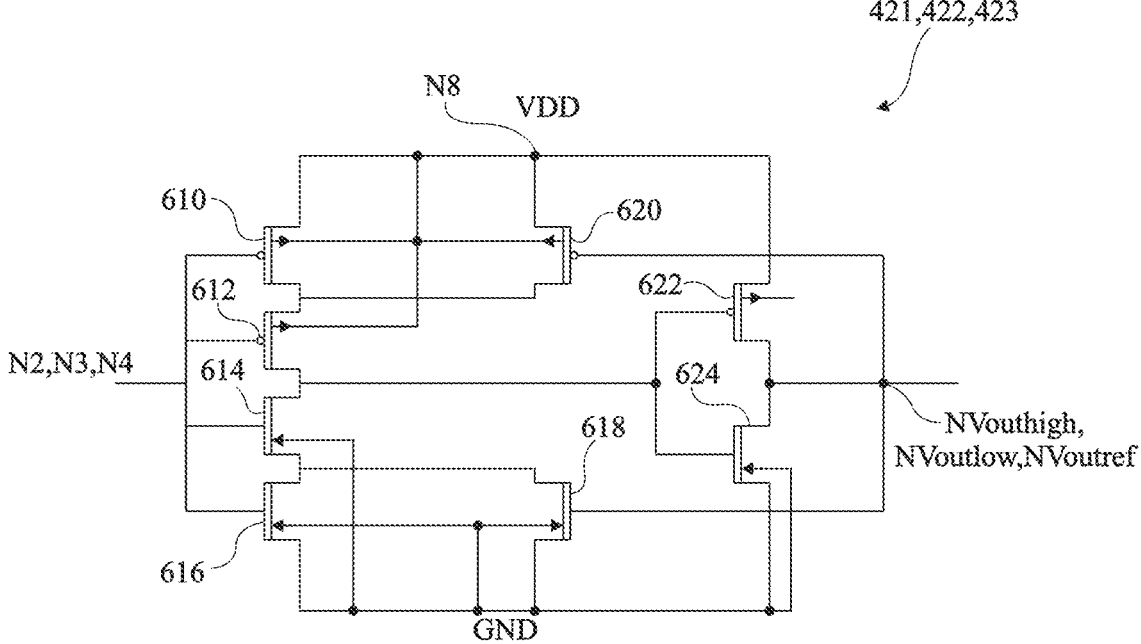
FIG. 6 shows a circuit of FIG. 4 according to an embodiment.

FIG. 6 shows a circuit of FIG. 4 according to an embodiment. More particularly, FIG. 6 illustrates one of the voltage comparators 421, 422, or 423 of FIG. 4.

In the shown example, one of voltage comparators 421, 422, 423 is described. The other voltage comparators 421, 422, 423 are for example similar, with dimensions and an architecture as close as possible to one another.

In FIG. 6, the illustrated voltage comparator comprises a dual inverter circuit coupling a power supply node N8 (VDD) and the ground (GND). The dual inverter circuit comprises two PMOS transistors 610, 612 and two NMOS transistors 614, 616 in series. The PMOS and NMOS transistors of the dual inverter comprise a common control node connected to the input node N2, N3, or N4 of the respective comparator.

In the shown example, the voltage comparator further comprises a PMOS transistor 620 having a conduction node coupled, preferably connected, to power supply node N8, a control node coupled, preferably connected, to the respective node NVouthigh, NVoutlow, NVoutref, and another conduction node coupled, preferably connected, to a conduction node common to transistors 610 and 612.

The illustrated voltage comparator also comprises an NMOS transistor 618 having a conduction node coupled, preferably connected, to ground, a control node coupled, preferably connected, to the respective node NVouthigh, NVoutlow, NVoutref, and another conduction node coupled, preferably connected, to a conduction node common to transistors 614 and 616.

In the shown example, the voltage comparator further comprises a PMOS transistor 622 and an NMOS transistor 624 having a conduction node common to the two transistors 622, 624 coupled, preferably connected, to the respective node NVouthigh, NVoutlow, NVoutref. Another conduction node of transistor 622 is coupled, preferably connected, to node N8 and another conduction node of transistor 624 is coupled, preferably connected, to ground. The control nodes of transistors 622, 624 are coupled together and to a conduction node common to transistors 612 and 614.

In the shown example, the substrate nodes of transistors 610, 612, and 620 are coupled together and connected to VDD. The substrate nodes of transistors 614, 616, and 618 are coupled to ground.

In an example, the transistors of voltage comparators 421, 422, 423 have dimensions and an architecture which are as similar as possible to one another. Particularly, transistors 610, 620; 612, 614; and 616, 618 preferably have dimensions and an architecture which are as similar as possible from one comparator to the other.

Figure 7:
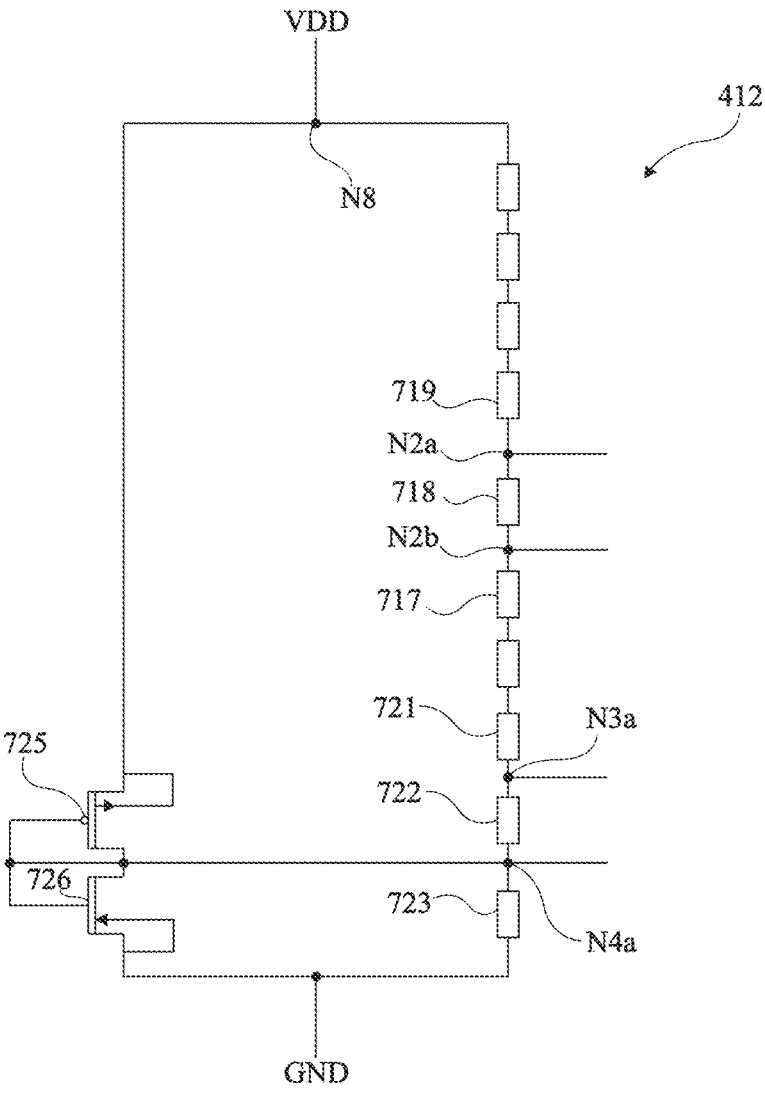
FIG. 7 shows a circuit of FIG. 4 according to an embodiment.

FIG. 7 shows a circuit of FIG. 4 according to an embodiment. More particularly, FIG. 7 illustrates an example of circuit 412.

In the shown example, circuit 412 comprises some ten resistors series-connected between a power supply node, which may be node N8, configured to be connected to a power supply rail of a voltage VDD, and the ground. Node N2a corresponds to the junction point between the fourth and the fifth resistors 719, 718 in the series. Node N2b corresponds to the junction point between the fifth and the sixth resistors 718, 717 in the series. Node N3$a$ corresponds to the junction point between the eighth and the ninth resistors 721, 722 in the series. Node N4$a$ corresponds to the junction point between the ninth and the tenth resistors 722, 723 in the series. The obtained resistor ladder enables to create different voltages at the level of nodes N2$a$, N2$b$, N3$a$, N4$a$.

In the shown example, circuit 412 further comprises a circuit comprising a PMOS transistor 725 and an NMOS transistor 726. Transistor 725 has a conduction node connected to power supply node N8, another conduction node connected to node N4$a$, a substrate node connected to node N8, and a control node connected to node N4$a$. Transistor 726 has a conduction node connected to node N4$a$, another conduction node connected to ground, a substrate node connected to ground, and a control node connected to node N4$a$.

By shorting the conduction nodes of transistors 726 and 725 corresponding to the drain of these transistors with their control node, this positions the voltage present on node N4$a$ as being in the middle of thresholds Vhyst_h and Vhyst_l. This enables to obtain a duty cycle very close to 50% at the output of comparator 423 if transistors 725 and 726 have dimensions and architectures similar to those of the respective transistors 612 and 614 of the comparator of FIG. 6. This voltage at node N4$a$ is imposed to the resistor ladder and enables to define the voltages present on nodes N3$a$, N2$a$, and N2$b$ according to their positioning on the resistor ladder. Nodes N3$a$, N2$b$, and N2$a$ may be placed at other points of the resistor ladder according to the voltage levels to be used as a comparison reference.

Figure 8:
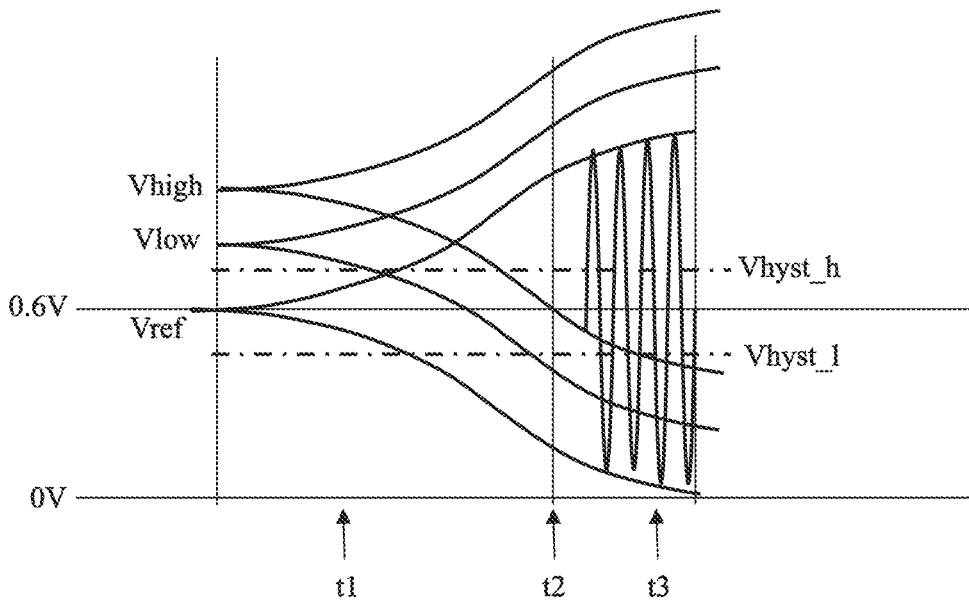
FIG. 8 shows a timing diagram of the operation of the circuit of FIG. 4.

FIG. 8 shows a timing diagram of the operation of the circuit of FIG. 4. More particularly, FIG. 8 illustrates voltages Vhigh, Vlow, and Vref with respect to thresholds Vhyst_l and Vhyst_h as a function of time.

Before a time $t_1$, signal Vref is centered on 0.6 V, for example, and Vhyst_l and Vhyst_h are located on either side of 0.6 V.

At a time $t_1$, only signal Vref generates a signal at the output of one of the voltage comparators. This signal has a duty cycle of 50%, for example, if the circuit 412 such as illustrated in FIG. 7 is used. None of signals Vhigh and Vlow has crossed the two thresholds Vhyst_l and Vhyst_h.

Between time $t_1$ and a subsequent time t2, signal Vxo, originating from the oscillator, increases in amplitude until threshold Vhyst_l is crossed by signal Vlow. The corresponding voltage comparator 422 then generates square signal Voutlow. The amplitude of signal Vxo is then greater than 2*(Vlow−Vref)+Vhyst_l. The amplitude of signal Vxo is well established above Vlow when signal Voutlow has the same frequency as signal Voutref.

At time t3, Vhigh has crossed thresholds Vhyst_h and Vhyst_l, which means that amplitude Vxo becomes greater than 2*(Vhigh−Vref)+Vhyst_l. It then becomes necessary, if the amplitude of Vxo is desired to be regulated between 2*(Vlow−Vref)+Vhyst_l and 2\*(Vhigh-Vref)+Vhyst_l, to decrease, for example, the power supply current of the oscillator.

Figure 9:
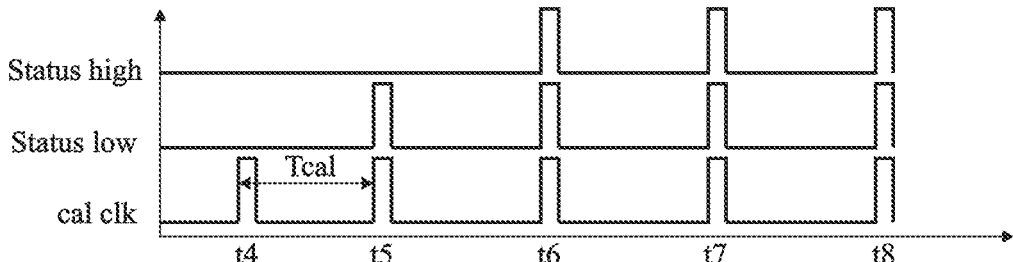
FIG. 9 shows a timing diagram of the operation of the circuit of FIG. 4.

FIG. 9 shows a timing diagram of the operation of the circuit of FIG. 4. More particularly, FIG. 9 illustrates the pulses on signals Status high, Status low, and cal clk as a function of time.

Signal cal clk is the reference signal, with pulses occurring periodically at times t4, t5, t6, t7, and t8 with a period Teal which is defined by circuit 530. In an example, for an oscillator frequency at 54.24 MHz, Teal is 75 μs.

At time t4, which for example corresponds to the time $t_1$ of FIG. 8, there are no pulses on signals Status low and Status high.

At time t5, which for example corresponds to the time t2 of FIG. 8, a pulse is present on signal Status low. This means that the amplitude of Vxo is between 2*(Vlow−Vref)+Vhyst_l and 2*(Vhigh−Vref)+Vhyst_l and that it is for example not necessary to regulate the oscillator power supply current.

At time t6, which for example corresponds to the time t3 of FIG. 8, a pulse is present on signals Status low and Status high. The amplitude of Vxo is thus greater than 2*(Vhigh−Vref)+Vhyst_l. If the amplitude of Vxo is desired to be regulated between 2*(Vlow−Vref)+Vhyst_l and 2*(Vhigh−Vref)+Vhyst_l, it is possible to decrease the oscillator power supply current for example by a factor 2.

At time t7, a pulse is still present on signals Status low and Status high. The amplitude of Vxo is thus still greater than 2*(Vhigh−Vref)+Vhyst_l. If the amplitude of Vxo is desired to be regulated between 2*(Vlow−Vref)+Vhyst_l and 2*(Vhigh−Vref)+Vhyst_l, it is possible to decrease the power supply current of the oscillator, for example, this time, by a factor 4 with respect to the current at time t5.

At time t8, a pulse is still present on signals Status low and Status high. The amplitude of Vxo is thus still greater than 2*(Vhigh−Vref)+Vhyst_l. If the amplitude of Vxo is desired to be regulated between 2*(Vlow−Vref)+Vhyst_l and 2*(Vhigh−Vref)+Vhyst_l, it is possible to decrease the power supply current of the oscillator, for example, this time, by a factor 8 with respect to the current at time t5. The same operation is repeated until the amplitude of Vxo returns between 2*(Vlow−Vref)+Vhyst_l and 2\*(Vhigh−Vref)+Vhyst_l, that is, there is no further pulse on Status high.

Dichotomously modulating the intensity of the oscillator power supply current enables to have the amplitude of Vxo smoothly converge towards the desired voltage range. Other types of feedback are possible.

Various embodiments and variants have been described. Those skilled in the art will understand that certain features of these various embodiments and variants may be combined, and other variants will occur to those skilled in the art. In particular, the number of flip-flops in series in the first, second, and third branches 512, 514, 516 of circuit 430 is for example between zero and more than four. The more flip-flops there are in these branches, the more robustness against parasitic pulses there is.

Finally, the practical implementation of the described embodiments and variants is within the abilities of those skilled in the art based on the functional indications given hereabove. In particular, regarding the generation of voltages Vhigh, Vlow and Vref, those skilled in the art may implement their knowledge to deliver signals having an offset voltage based on signal Vxo. Even though the embodiment of FIG. 7 enables to generate a signal Voutref having an almost perfect 50% duty cycle, it is possible to generate Vref in other ways within the abilities of those skilled in the art so that it is not necessary for Vref to be generated to provide at the output of comparator 423 a signal Voutref which has a 50% duty cycle.

Circuit 440 is not described in detail but those skilled in the art will be capable of implementing their knowledge to form a circuit capable of verifying whether pulses are present at the same time on cal clk, Status low, and Status high and to accordingly modulate a parameter of the oscillator to modify its amplitude. Those skilled in the art will be capable of implementing their knowledge for the feedback control acting on the oscillation amplitude of oscillator 404. In an example, those skilled in the art may implement oscillator 404 in Colpitts topology using a negative resistor called Rneg proportional to the current. A current control thus varies the negative resistance. It is however also possible to vary the negative resistance Rneg of the Colpitts-type assembly by varying capacitance values. Those skilled in the art may implement other types of assemblies for the control feedback of the oscillator such as voltage-controlled assemblies.

The invention claimed is:

1. An electronic circuit comprising:
   a first circuit configured to generate, based on a first periodic analog signal, a plurality of second signals having voltage levels offset from each other;
   a second circuit configured to generate third periodic digital signals according to respective crossings, by the second signals, of at least one threshold; and
   a third circuit configured to determine an amplitude range in which the first periodic analog signal is located, according to a number of the third periodic digital signals.

2. The electronic circuit according to claim 1, wherein the second circuit is configured to generate each third periodic digital signal in response to a corresponding one of the second signals crossing two thresholds.

3. The electronic circuit according to claim 1, wherein the electronic circuit comprises a fourth circuit configured to adjust an amplitude of the first periodic analog signal according to the determined amplitude range.

4. The electronic circuit according to claim 3, wherein the third circuit comprises three branches, wherein each branch comprises a plurality of flip-flops in series, and wherein each branch is configured to respectively receive one of the third periodic digital signals on a clock input of the flip-flops of the respective branch.

5. The electronic circuit according to claim 4, wherein each branch comprises at least two D-type flip-flops in a series of flip-flops.

6. The electronic circuit according to claim 5, wherein the third circuit comprises a first logic block configured to perform an AND function based on an output of the series of flip-flops of a first branch from among the branches and based on an output of the series of flip-flops of a second branch from among the branches.

7. The electronic circuit according to claim 6, wherein the third circuit comprises a second logic block configured to perform an AND function based on the output of the series of flip-flops of the second branch and based on an output of the series of flip-flops of a third branch from among the branches.

8. The electronic circuit according to claim 7, wherein the third circuit is configured to generate a first pulse on a first path in response to outputs of the first and second branches having a high logic state.

9. The electronic circuit according to claim 8, wherein the third circuit is configured to generate a second pulse on a second path in response to the output of the second branch and an output of the third branch having the high logic state.

10. The electronic circuit according to claim 6, wherein the third circuit is configured to generate pulses on first and second paths in response to a signal at an output of the second branch having a high logic state.

11. The electronic circuit according to claim 10, wherein the fourth circuit is configured to generate a control signal modifying the amplitude of the first periodic analog signal according to a presence or an absence of the pulses on the first and second paths.

12. The electronic circuit according to claim 2, wherein each third periodic digital signal is generated by a respective voltage comparator having the two thresholds as trigger thresholds.

13. The electronic circuit according to claim 12, wherein each voltage comparator is of Schmitt trigger type.

14. The electronic circuit according to claim 12, wherein each voltage comparator has an input node coupled to a first node configured to receive the first periodic analog signal, via a respective capacitive element, and wherein each input node of each comparator is configured to respectively receive one of the second signals.

15. The electronic circuit according to claim 14, wherein the first circuit comprises resistors in series between a power supply node configured to receive a power supply voltage and ground, each of the second signals being generated based on a voltage present on a different node corresponding to a junction point of two adjacent resistors of the resistors in series.

16. The electronic circuit according to claim 15, wherein the first circuit comprises a p-channel metal oxide semiconductor (PMOS) transistor and an n-channel metal oxide semiconductor (NMOS) transistor, each having a conduction node connected to a reference node, control nodes of the PMOS and NMOS transistors being connected to the reference node, another conduction node of the PMOS transistor being connected to the power supply node, and another conduction node of the NMOS transistor being connected to the ground.

17. The electronic circuit according to claim 16, wherein the reference node is coupled to the ground via one of the resistors of the resistors in series.

18. The electronic circuit according to claim 17, wherein each comparator comprises a dual inverter circuit coupling the power supply node and the ground;
   wherein the dual inverter circuit comprises two PMOS transistors and two NMOS transistors in series; and
   wherein a control node, common to the PMOS and NMOS transistors of the dual inverter circuit, is coupled to the reference node.

19. The electronic circuit according to claim 1, wherein the first periodic analog signal originates from a crystal oscillator.

20. A near-field communication (NFC) microcontroller comprising:
   a processor; and
   an electronic circuit, communicatively coupled to the processor, comprising:
      a first circuit configured to generate, based on a first periodic analog signal, a plurality of second signals having voltage levels offset from each other;
      a second circuit configured to generate third periodic digital signals according to respective crossings, by the second signals, of at least one threshold; and
      a third circuit configured to determine an amplitude range in which the first periodic analog signal is located, according to a number of the third periodic digital signals.

21. A method of operating an electronic circuit, the method comprising:
   generating, with a first circuit of the electronic circuit, based on a first periodic analog signal, a plurality of second signals having voltage levels offset from each other;

generating, with a second circuit of the electronic circuit, third periodic digital signals according to respective crossings, by the second signals, of at least one threshold; and determining, with a third circuit of the electronic circuit, an amplitude range in which the first periodic analog signal is located, according to a number of the third periodic digital signals.

22. The method according to claim 21, further comprising generating, by the second circuit, each third periodic digital signal in response to a corresponding one of the second signals crossing two thresholds.

23. The method according to claim 21, further comprising adjusting, by a fourth circuit of the electronic circuit, an amplitude of the first periodic analog signal according to the determined amplitude range.

24. The method according to claim 21, wherein the third circuit comprises three branches, each branch comprising a plurality of flip-flops in a series of flip-flops, and the method further comprises:

receiving, respectively by each branch, one of the third periodic digital signals on a clock input of the flip-flops of the respective branch.

25. The method according to claim 24, wherein each branch comprises at least two D-type flip-flops in series, and the method further comprises:

performing an AND function, by a first logic block of the third circuit, based on an output of the series of flip-flops of a first branch from among the branches and based on an output of the series of flip-flops of a second branch from among the branches.

26. The method according to claim 22, further comprising generating, by a respective voltage comparator having the two thresholds as trigger thresholds, a respective one of the third periodic digital signals.

27. The method according to claim 21, further comprising receiving the first periodic analog signal from a crystal oscillator.

* * * * *